(12) United States Patent
Gendler et al.

(10) Patent No.: US 10,126,775 B2
(45) Date of Patent: *Nov. 13, 2018

(54) CURRENT SENSOR BASED CLOSED LOOP CONTROL APPARATUS

(71) Applicant: Intel Corporation, Santa Clara, CA (US)

(72) Inventors: Alexander Gendler, Kiriat Motzkin (IL); Kosta Luria, M (IL); Arye Albahari, Kirat Yam (IL); Ohad Nachshon, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/448,332

(22) Filed: Mar. 2, 2017

(65) Prior Publication Data

US 2017/0177022 A1 Jun. 22, 2017

Related U.S. Application Data

(63) Continuation of application No. 14/751,875, filed on Jun. 26, 2015, now Pat. No. 9,612,613.

(51) Int. Cl.
*G06F 1/08* (2006.01)
*G01R 19/165* (2006.01)
(Continued)

(52) U.S. Cl.
CPC ......... *G06F 1/08* (2013.01); *G01R 19/16528* (2013.01); *G01R 19/16533* (2013.01);
(Continued)

(58) Field of Classification Search
CPC ..... G06F 1/06; G06F 1/10; G06F 1/12; G06F 1/26; G06F 13/14; G06F 21/73;
(Continued)

(56) References Cited

U.S. PATENT DOCUMENTS 5,485,127 A * 1/1996 Bertoluzzi .............. H03L 1/027
331/14
6,329,860 B1 12/2001 Komatsu
(Continued)

FOREIGN PATENT DOCUMENTS

WO 2012129151 9/2012

OTHER PUBLICATIONS

Notification of Transmittal of the International Search Report and the Written Opinion of the International Searching Authority issued for International Patent Application No. PCT/US2016/033626, dated Sep. 1, 2016.

*Primary Examiner* — John Poos
(74) *Attorney, Agent, or Firm* — Womble Bond Dickinson (US) LLP

(57) ABSTRACT

A method and apparatus for performing current control for an integrated circuit are described. In one embodiment the apparatus comprises core logic coupled to receive a first current; a clock generator to generate a first clock signal; and a closed loop current controller coupled to the clock generator and coupled to provide a second clock signal to the core logic based on the first clock signal, the current controller to control an amount of the first current received by the core logic by changing the first clock signal to generate the second clock signal.

17 Claims, 7 Drawing Sheets

(51) Int. Cl.
  *G06F 1/06*    (2006.01)
  *G06F 1/26*    (2006.01)
  *G01R 1/20*    (2006.01)
  *G01R 19/00*   (2006.01)

(52) U.S. Cl.
  CPC .................. *G06F 1/06* (2013.01); *G06F 1/26* (2013.01); *G01R 1/203* (2013.01); *G01R 19/0092* (2013.01)

(58) Field of Classification Search
  CPC ......... G06F 21/74; G06F 11/27; G01R 19/00; G01R 21/00; G01R 21/133; G01R 31/40
  USPC ......................................... 327/291, 298, 299
  See application file for complete search history.

(56) References Cited

U.S. PATENT DOCUMENTS

| | | |
|---|---|---|
| 2004/0017234 A1 | 1/2004 | Tam et al. |
| 2009/0134857 A1 | 5/2009 | Zeng et al. |
| 2010/0134079 A1 | 6/2010 | Liu et al. |
| 2014/0344596 A1 | 11/2014 | Keppel ................ G06F 1/3206 713/322 |

* cited by examiner

Freq_eff = 16/16 = 100%

Freq_eff = 13/16 = 81%

Freq_eff = 8/16 = 50%

CURRENT SENSOR BASED CLOSED LOOP CONTROL APPARATUS

RELATED APPLICATION

This patent application is a continuation application of and claims the benefit of U.S. application Ser. No. 14/751,875, entitled "CURRENT SENSOR BASED CLOSED LOOP CONTROL APPARATUS", filed Jun. 26, 2015, the benefit of and priority to which claim thereof, and entire contents of which is incorporated by reference in its entirety.

FIELD OF THE INVENTION

Embodiments of the present invention relate to the field of power delivery for integrated circuits (ICs); more particularly, embodiments of the present invention relate to performing current control for a core or other portion of an IC using clock throttling.

BACKGROUND OF THE INVENTION

The maximum load current of an integrated circuit (IC) such as a processor represents the maximum peak current that the IC is capable of drawing. This is referred to herein as IccMax. Today, the IccMax is defined by frequency (often measured per frequency bin) and the Icc protector level. Based on those numbers, design decisions are made as to what frequency bins are IccMax limited and as to the size of the voltage regulator (VR) that is required for the IC.

In the case of a processor, the difference between IccMax and the average current that is drawn by the processor, referred to as Icc average, can be more than 20%. Controlling IccMax in order to reduce IccMax would result in large gains in board die area due to the need for a smaller VR (because it needs to supply less current) and result in the IccMax limited frequency bins gaining more frequency.

IccMax for an IC has been controlled in the past by limiting the frequency at which the IC is run. However, even if one application is able get to some Icc level, all other applications get the same frequency restriction without reaching that same limit, which may hurt their performance. Thus, limiting the frequency is not desirable.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
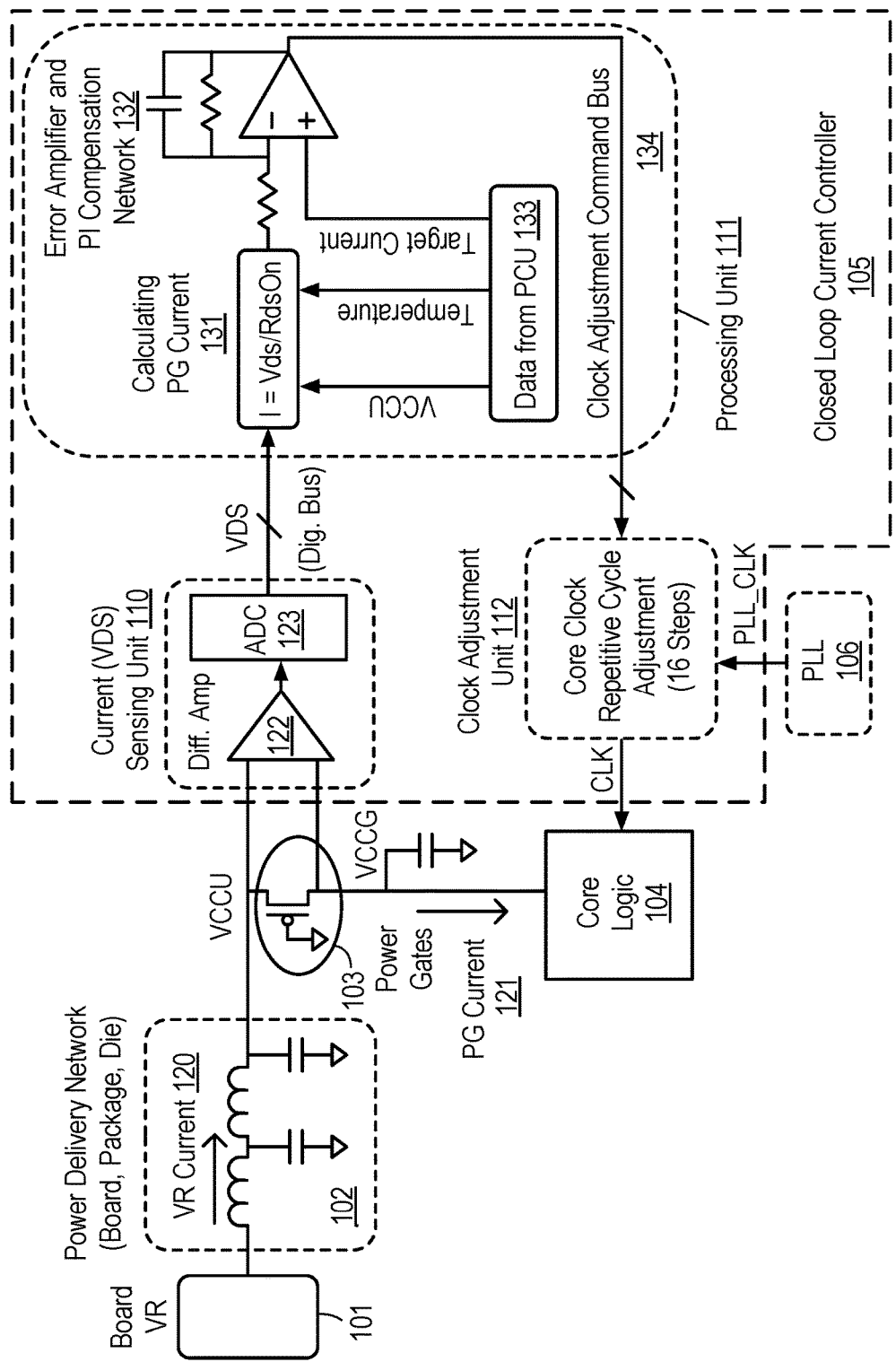
FIG. 1 is a block diagram of one embodiment of a control loop for controlling current into core.

A method and apparatus for performing current control for an integrated circuit (IC) in a system are described. In one embodiment, the system includes a voltage regulator (VR) that provides a voltage to the IC. The techniques described herein allow limiting the current to the IC to a desirable level. With these techniques, the maximum current for corresponding frequency bin and Icc protector level limit can be selected. Furthermore, with these techniques, the size of the VR may be controlled, which allows more IccMax limited bins.

A goal of one embodiment of the present invention is to limit the VR output current, referred to as the VR current, to pre-defined level "target current." To achieve this goal, the core current of an IC (e.g., the central processing unit (CPU) core current (e.g., power gate (PG) Current)) is regulated to the predefined, or threshold, level referred to herein as the "target current", by use of a time-continuous control loop. In one embodiment, the time-continuous control loop is a close-loop control system that comprises a system of one or more power gate (PG) current sensors and a core current control apparatus.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

In one embodiment, the current control controls the current of a core of an integrated circuit (IC). In one embodiment, the IC comprises core logic coupled to receive a core current, a clock generator (e.g., phase-locked loop (PLL)) to generate a clock signal, and a closed loop current controller coupled to the clock generator and coupled to provide a second clock signal to the core logic based on the first clock signal. By controlling the effective frequency of the clock signal to the core clock, the current controller control the amount current received by the core logic. In other words, the current controller changes by the amount of current received by the core logic by changing the effective frequency of the clock signal received by the core logic.

In one embodiment, the current provided to the core is based on a voltage regulator (VR) current. By controlling the current received by the core logic, the VR current is controlled as well.

In one embodiment, the closed loop current controller comprises a current sensing unit to obtain a measure indicative of the current being received into the core logic, a processing unit coupled to the current sensing unit to generate an output based on comparison a calculated current indicative of the current being received into the core based on the measure from the current sensing unit with a target current, and a clock adjustment unit coupled to receive the output from the processing unit, coupled receive the clock signal from the clock generator, and coupled to provide a clock signal to the core logic. In operation, the clock adjustment unit is able to modify the clock signal from the clock generator to create the core clock signal in such a way as to limit the core current being received into the core logic based on the output from the processing unit. In one embodiment, the clock adjustment unit modifies the clock signal from the clock generator by removing pulses of that clock signal to create the core clock signal.

In one embodiment, the current measurement and sensing unit measures current passing through circuitry (e.g., a power gate, a set of power gates, mother board voltage regulator (MBVR), power management integrated circuit (PMIC), fully integrated voltage regulator (FIVR)) coupled to the core logic by measuring voltage over the circuitry. The current sensing unit further comprises an analog-to-digital converter (ADC) to convert the voltage into a digital value.

In one embodiment, the processing unit comprises current calculation logic to output a calculated current based on a voltage output from the current sensing unit, and an error amplifier and compensation network to compare calculated current to a target current and generate clock adjustment commands based on results of comparing the calculated current to a target current. In one embodiment, the error amplifier and compensation network includes a proportional integral (PI) compensation network.

In one embodiment, closed loop current controller includes a clock repetitive cycle adjustment unit to generate the second clock signal by adjusting dynamically an effective frequency of the first clock signal.

FIG. 1 is a block diagram of one embodiment of a control loop for controlling current into core. In one embodiment, the core logic is part of a processor core in a microprocessor or system-on-a-chip (SoC). In one embodiment, a processor core, or core logic, is logic located in the microprocessor or SoC capable of maintaining an independent architectural state, wherein each independently maintained architectural state is associated with at least some dedicated execution resources.

Referring to FIG. 1, a voltage regulator (VR) 101 provides a voltage to the core having power gate(s) 103 and core logic 104. In one embodiment, VR 101 is coupled to a motherboard. In one embodiment, the core is also coupled to the motherboard.

VR 101 provides the voltage through a power delivery network 102 to the core. The power proceeds through power delivery network 102 prior to undergoing the real transients of core logic 104. In one embodiment, power delivery network 102 represents the motherboard, package and die through which the power is transferred to the core in the die, and includes the passive parasitic impedance related to the traces on the motherboard, vias, etc., through which VR current 120 is driven.

VR current 120 proceeds into the core through power gate(s) 103 to core logic 104. The current that is traveling from power gate(s) 103 to core logic 104 is referred to herein as the power gate (PG) current 121.

Closed loop controller 105 performs the closed loop control of PG current 121 in order to limit VR current 120. Closed loop controller 105 calculates PG current 121 inside the core using current sensing unit 110 and processing unit 111. Using the assumption that PG current 121 (i.e., the current in the core) is directly proportional to the drain-source voltage ($V_{ds}$) across power gates 103, current sensing unit 110 measures PG current 121 through one or more power gates 103 by measuring the voltage over those power gates 103. In one embodiment, current sensing unit 110 measures the $V_{ds}$ voltage on power gates 103 using a differential amplifier 122. In another embodiment, a differential ring oscillator is used. Current sensing unit 110 converts the measured voltage into digital format with an analog-to-digital (ADC) 123 and sends the measured voltage in digital format to processing unit 111 for current calculation. In one embodiment, power gates 103 are distributed throughout the core and multiple current sensing units. The measured voltages from the multiple current sensing units are averaged together and used to provide the data about the average core current. For example, in one embodiment, there are 16 power gates distributed throughout the core and 16 current sensing units to take voltage measurements, which are averaged together into a signal voltage value that is used for the current calculation. In one embodiment, the averaging is performed in the processing unit. In one embodiment, each current sensing unit has a bus to the processing unit.

Processing unit 111 calculates PG current 121 using computation unit 131 using the following formula:

$$I = V_{ds}/R_{dsOn}$$

where the drain-source resistance for when the power gate is on ($R_{dsOn}$) is obtained by silicon characterization and obtained, in one embodiment, from a memory (e.g., register) stored on the die. In one embodiment, for better accuracy, the data about $V_{ccu}$ and temperature is involved in calculations, provided by a power control unit (PCU) 133 in the core that performs power management. $V_{ccu}$ (ungated) is the power provided to the core before the power gate, and $V_{ccg}$ is the final core power after the power gate. The $R_{dsOn}$ depends on both temperature and the $V_{ccu}$. More specifically, in one embodiment, the $R_{dsOn}$ increases as the temperature rise and decreases when $V_{ccu}$ increases.

After calculating PG current 121, processing unit 111 uses an error amplifier and proportional integral (PI) compensation network 132 to compare the calculated PG current with a target current (i.e., a current threshold). In one embodiment, the target current is from PCU 133. Error amplifier and PI compensation network 132 ensure that the regulated core current (which is assumed equal to PG current 121) is equal to the target current, provided by PCU 133. In one embodiment, an error amplifier and PI compensation network is used because there are a number of cores on the chips and a Continues Control Loop (rather than a comparator-based control loop) is used. This loop includes elements such as the current measurement element, the control (compensation) element and the adjustment element. The compensation parameters are dependent on the loop delay (i.e. calculation latency). The compensation properties will define the current overshoot and the settle time.

Based on the results of the comparison between the calculated PG current and the target current, error amplifier and PI compensation network 132 generates a clock adjustment command on clock adjustment command bus 134.

Note that in one embodiment the operations performed by processing unit 111, including those performed by computation unit 131 and error amplifier compensation network 132, are performed digitally.

Clock adjustment unit 112 receives clock adjustment commands from error amplifier and PI compensation network 132 and adjusts dynamically the effective frequency (Freq_eff) of the core clock, which includes the clock for core logic 104, where the effective frequency is directly proportional to the core current ($I_{core}=C*V*f$). In one embodiment, clock adjustment unit 112 performs the adjustment by adjusting the clock repetitive cycle according to the commands which are streaming from clock adjustment command bus 134. In this case, the number of repetitive cycle steps defines the quantization ripple of PG current 121. With respect to the quantization ripple, each time the clock repetitive cycle is changing, a change in load current is created. This creates voltage ripple, referred to as quantization ripple. The strength of this ripple depends on the number of maximum possible clock repetitive pulses (16 in one example).

Figure 2A:
FIG. 2A illustrates a clock waveform having an effective frequency of 100%.
Figure 2B:
FIGS. 2B and 2C illustrate clock waveforms with an effective frequency of 81% (13 of 16 pulses) and 50% (8 of 16 pulses), respectively.
Figure 2C:

FIGS. 2A-2C illustrate three example waveforms. FIG. 2A illustrates a clock waveform having an effective frequency of 100% obtained from a repetitive pulse train of 16 pulses. In other words, the clock waveform provided to core logic 104 is the same as is output from clock generator (e.g., PLL) 106. FIGS. 2B and 2C illustrate clock waveforms with an effective frequency of 81% (13 of 16 pulses) and 50% (8 of 16 pulses), respectively, obtained from repetitive pulse train of 16 pulses. By modifying the number of pulses in the clock waveform with an effective frequency of 100%, clock waveforms with other effective frequencies may be generated.

In one embodiment, the clock waveforms with an effective frequency of less than 100% are generated by a pulse swallowing circuit that, in essence, removes pulses from the clock signal.

Note that changing the effective frequency of core clock using clock adjustment unit 112 rather than by changing the PLL clock is performed because the direct change of PLL clock can only be performed at very slow rate or else the PLL will lose its lock. On the other hand, the techniques described herein can change the effective clock frequency almost instantaneously. Furthermore, the disclosed techniques does not create speed paths inside the core logic.

Figure 3:
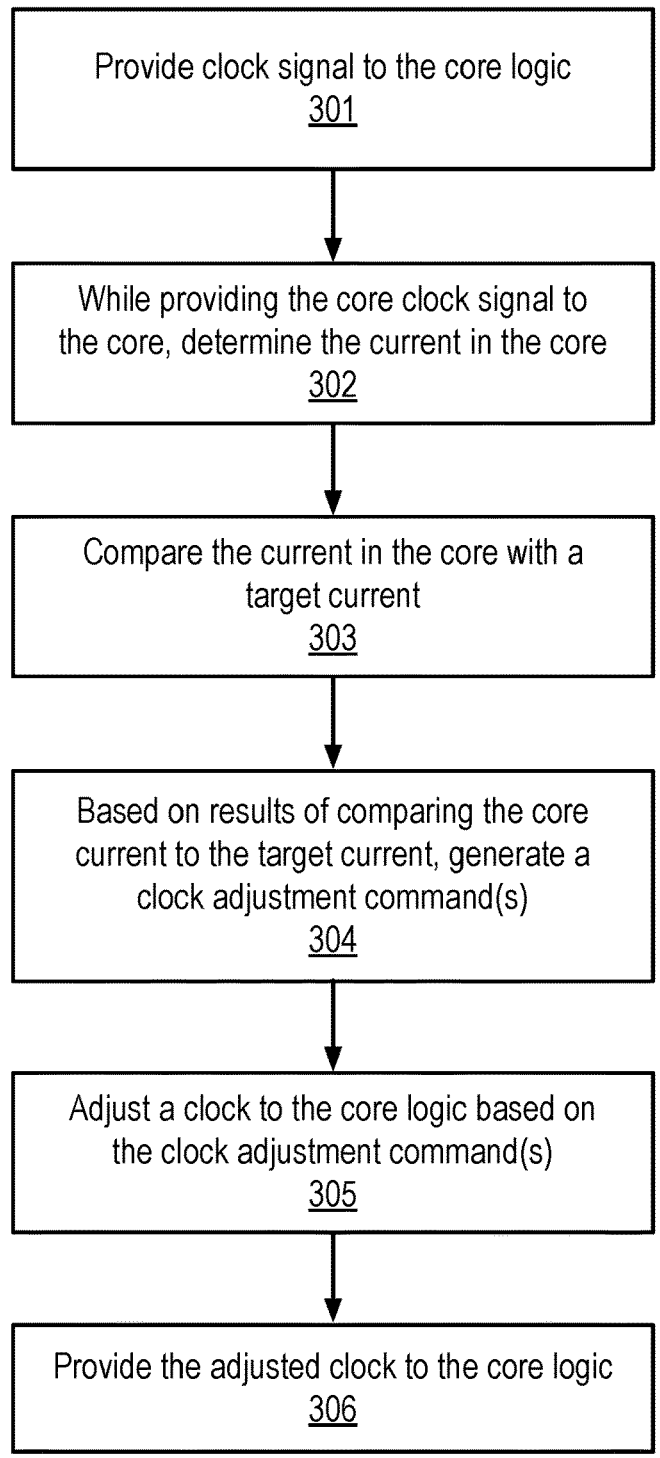
FIG. 3 is a flow diagram of one embodiment of a process for controlling the current in an integrated circuit.

FIG. 3 is a flow diagram of one embodiment of a process for controlling the current in an integrated circuit. In one embodiment, the current is being controlled in a core of an integrated circuit. In one embodiment, the current that is provided to core logic in a core is controlled. The process of FIG. 3 is performed by processing logic that may comprise hardware (circuitry, dedicated logic, etc.), software (such as is run on a general purpose computer system or a dedicated machine), firmware, or a combination of these three.

Referring to FIG. 3, the process begins by processing logic providing clock signal to the core logic (processing block 301). In one embodiment, the clock signal originates from a clock generator (e.g., a phase-locked loop (PLL)).

Figure 4:
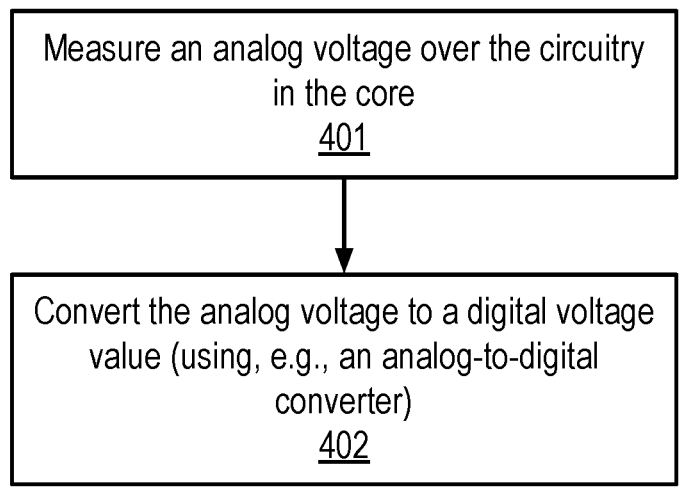
FIG. 4 is a flow diagram of one embodiment of a process for determining the current in the core.

While providing the core clock signal to the core, processing logic determines the current in the core (processing block 302). In one embodiment, determining the current in the core comprise measuring voltage in the core and calculating a current value based on the measured voltage. FIG. 4 is a flow diagram of one embodiment of a process for determining the current in the core. The process is performed by processing logic that may comprise hardware (circuitry, dedicated logic, etc.), software (such as is run on a general purpose computer system or a dedicated machine), firmware, or a combination of these three.

Referring to FIG. 4, the process begins by measuring an analog voltage over the circuitry in the core (e.g., a power gate, a set of power gates distributed over the core) through which the core current passes (processing block 401). Next, processing logic converts the analog voltage to a digital voltage value using an analog-to-digital converter (ADC) (processing block 402). Using the digital voltage value, processing logic calculates a value for the current in the core using the resistance associated with the circuitry (e.g., the resistance of the power gate (e.g., the drain-source resistance).

In one embodiment, the analog voltage is measured over multiple circuitries in a core (e.g., multiple power gates distributed throughout the core). In such a case, each of the measured analog voltages is converted to digital form and then the digital voltage values are averaged and the average is used for calculating the core current.

Referring back to FIG. 3, processing logic compares the current in the core with a target current (processing block 303). As discussed above, in one embodiment, the current in the core is calculated from a voltage measured across circuitry in the core through which the core current passes.

Based on results of comparing the core current to the target current, processing logic generates a clock adjustment command(s) (processing block 304) and adjusts a clock to the core logic based on the clock adjustment command(s) (processing block 305). In one embodiment, the adjustment to the core clock comprises adjusting dynamically an effective frequency of the core clock signal. In cases where the PG current, and thus the VR current, needs to be limited, then the frequency of the core clock signal is throttled. In one embodiment, the amount of throttling is static. In one embodiment, the throttling that provides a predetermined (e.g., the best) power/performance ratio is used. In one embodiment, the clock to the core logic is adjusted by removing (e.g., swallowing) pulses of the clock signal from the clock generator. Thereafter, the adjusted clock is provided to the core logic (processing block 306).

Figure 5:
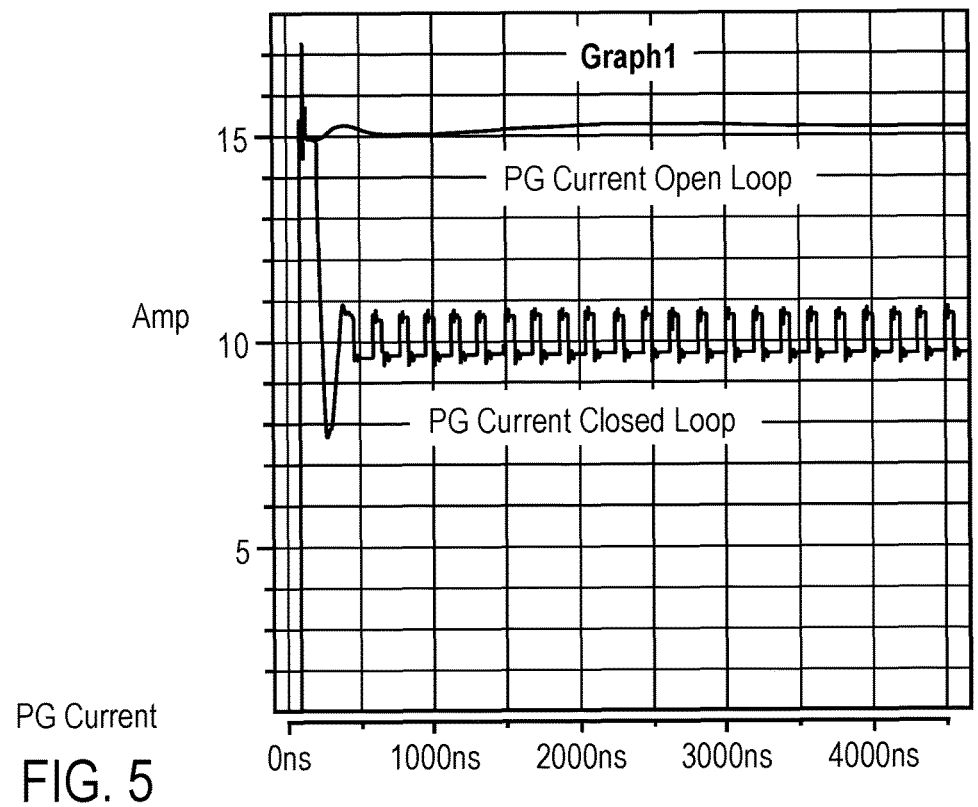
FIG. 5 illustrates simulation results of PG current for both open and closed loop control.

FIG. 5 illustrates simulation results of PG current for both open and closed loop control. Referring to FIG. 5, note that a significant current overshoot is observed and then steady state at the target value. A "quantization ripple" is observed, which comes from quantization of clock by clock adjustment unit 112. If more granularity is used in clock adjustment unit 112 (e.g., 32 instead of 16) the ripple would be half.

Figure 6:
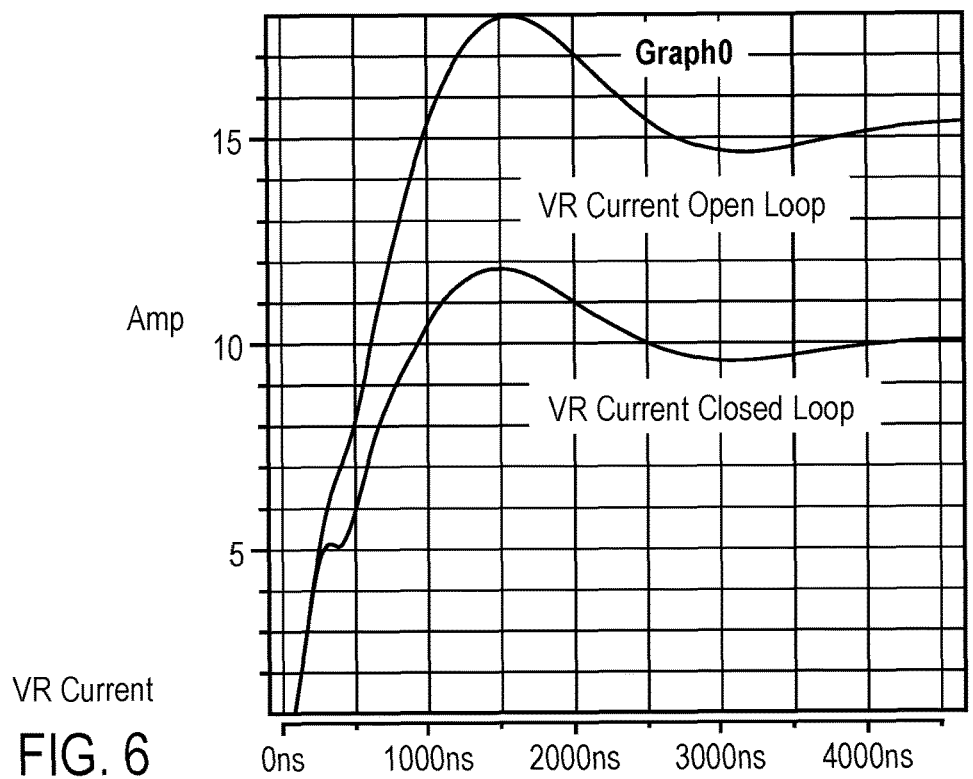
FIG. 6 illustrates simulation results of the VR current for open and closed loop control.

FIG. 6 illustrates simulation results of the VR current for open and closed loop control. Referring to FIG. 6, note that a small current overshoot is observed and then steady state at the target value. Also, there is no "quantization ripple" of the VR current.

Figure 7:
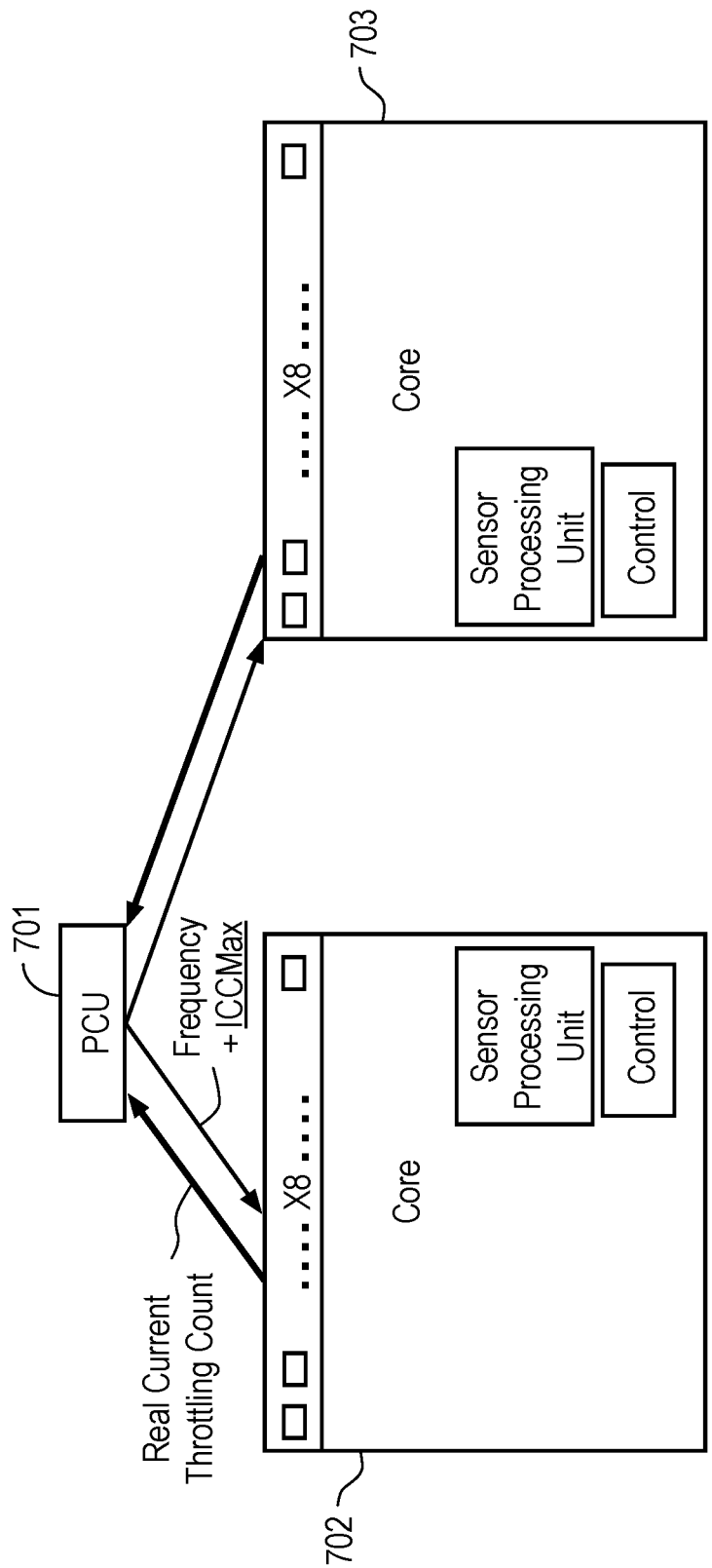
FIG. 7 is a block diagram of a portion of an integrated circuit.

FIG. 7 is a block diagram of a portion of a processor having two cores and a power control unit (PCU). Referring to FIG. 7, PCU 701 is coupled to cores 702 and 703. Although only two cores are shown, there may be more than two cores. PCU 701 provides the frequency and IccMax to cores 702 and 703. That is, in one embodiment, PCU 701 decides what frequency each core is to run, based on software request and hardware status (for example, temperature impact). Each of cores 702 and 703 includes one or more current sensors. In one embodiment, each of cores 702 and 703 includes 16 current sensors per core. Each core also includes a sensor processing unit, along with associated control, to compare the calculated current with PCU defined threshold.

Telemetry between cores 702 and 703 is used to send information to PCU 701. In one embodiment, if there are too many throttling cases, PCU 701 increases the current threshold (i.e., the target current) to allow less throttling.

Thus, the techniques described above to control the current into a processor or SOC core allow for controlling the current without limiting the frequency.

The use of the techniques has a huge benefit for device, client and server systems. For all types of SOCs and processors, the result of simulations show that using the techniques described above enables the use of a 20% smaller VR while having a minimum performance impact. Therefore, the use of the techniques described herein reduce the VR size and cause smaller form factors and lower cost for customers. Thus, the techniques described herein are beneficial in reducing the bill of materials (BOM) cost of a system by being able to use a smaller, and thus cheaper VR.

Furthermore, the techniques allow smaller form factors. Moreover, the techniques improve the frequency of configurations have a limited, or lower, maximum load current (ICCMax limited systems) by allowing them to run on a higher frequency.

Figure 8:
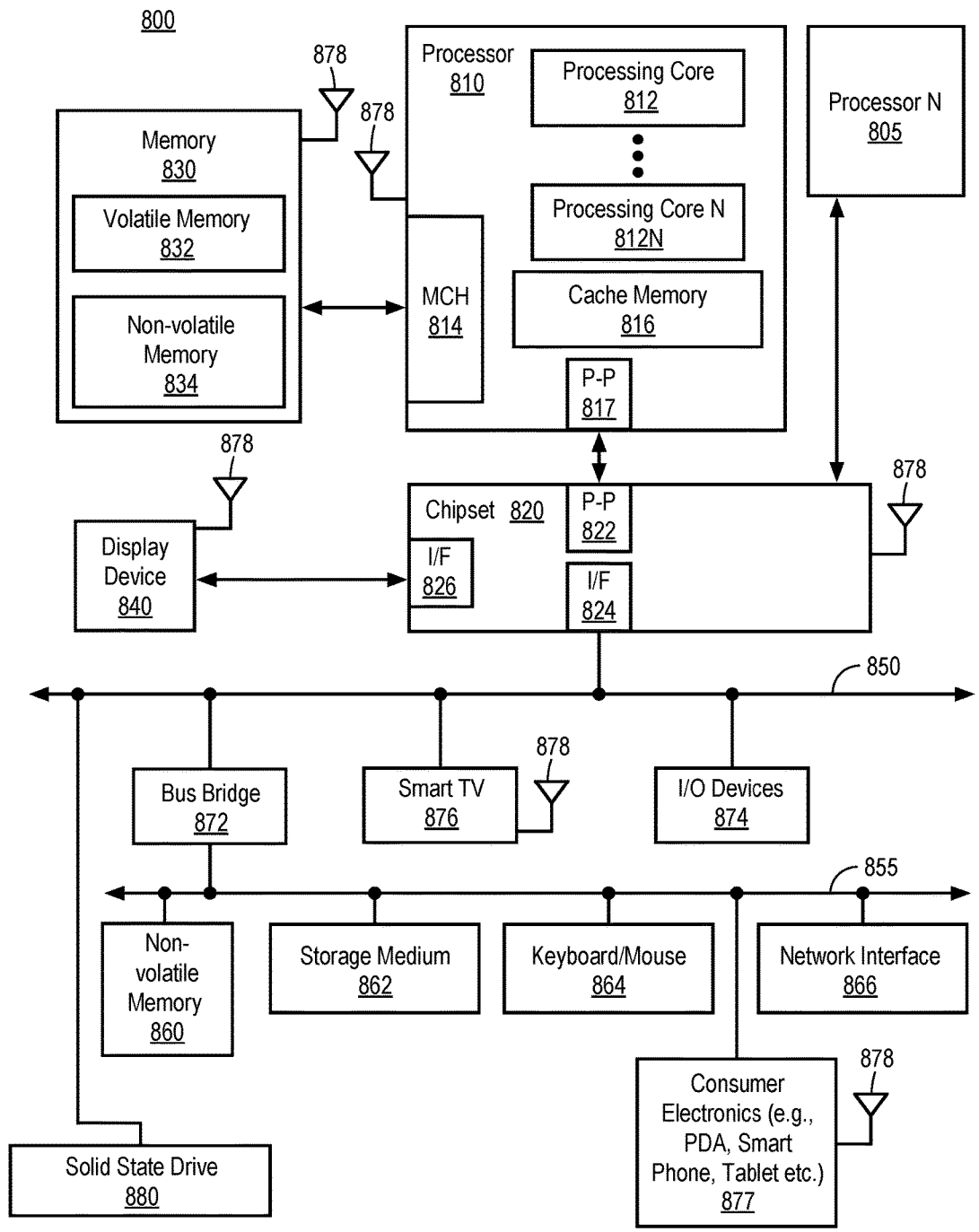
FIG. 8 is a block diagram of one embodiment of a system.

FIG. 8 is one embodiment of a system level diagram 800 that may incorporate the techniques described above. For example, the techniques described above may be incorporated into a processor core of a processor in system 800.

Referring to FIG. 8, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In another embodiment, system 800 implements the methods disclosed herein and may be a system on a chip (SOC) system.

In one embodiment, processor 810 has one or more processor cores 812 to 812N, where 812N represents the Nth processor core inside the processor 810 where N is a positive integer. In one embodiment, system 800 includes multiple processors including processors 810 and 805, where processor 805 has logic similar or identical to logic of processor 810. In one embodiment, system 800 includes multiple processors including processors 810 and 805 such that processor 805 has logic that is completely independent from the logic of processor 810. In such an embodiment, a multi-package system 800 is a heterogeneous multi-package system because the processors 805 and 810 have different logic units. In one embodiment, processing core 812 includes, but is not limited to, pre-fetch logic to fetch instructions, decode logic to decode the instructions, execution logic to execute instructions and the like. In one embodiment, processor 810 has a cache memory 816 to cache instructions and/or data of the system 800. In another embodiment of the invention, cache memory 816 includes level one, level two and level three, cache memory, or any other configuration of the cache memory within processor 810.

In one embodiment, processor 810 includes a memory control hub (MCH) 814, which is operable to perform functions that enable processor 810 to access and communicate with a memory 830 that includes a volatile memory 832 and/or a non-volatile memory 834. In one embodiment, memory control hub (MCH) 814 is positioned outside of processor 810 as an independent integrated circuit.

In one embodiment, processor 810 is operable to communicate with memory 830 and a chipset 820. In such an embodiment, SSD 880 executes the computer-executable instructions when SSD 880 is powered up.

In one embodiment, processor 810 is also coupled to a wireless antenna 878 to communicate with any device configured to transmit and/or receive wireless signals. In one embodiment, wireless antenna interface 878 operates in accordance with, but is not limited to, the IEEE 802.11 standard and its related family, HomePlug AV (HPAV), Ultra Wide Band (UWB), Bluetooth, WiMAX, or any form of wireless communication protocol.

In one embodiment, the volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory (e.g., NAND, NOR), phase change memory (PCM), read-only memory (ROM), electrically erasable programmable read-only memory (EEPROM), or any other type of non-volatile memory device.

Memory 830 stores information and instructions to be executed by processor 810. In one embodiment, chipset 820 connects with processor 810 via Point-to-Point (PtP or P-P) interfaces 817 and 822. In one embodiment, chipset 820 enables processor 810 to connect to other modules in the system 800. In one embodiment, interfaces 817 and 822 operate in accordance with a PtP communication protocol such as the Intel QuickPath Interconnect (QPI) or the like.

In one embodiment, chipset 820 is operable to communicate with processor 810, 805, display device 840, and other devices 872, 876, 874, 860, 862, 864, 866, 877, etc. In one embodiment, chipset 820 is also coupled to a wireless antenna 878 to communicate with any device configured to transmit and/or receive wireless signals.

In one embodiment, chipset 820 connects to a display device 840 via an interface 826. In one embodiment, display device 840 includes, but is not limited to, liquid crystal display (LCD), plasma, cathode ray tube (CRT) display, or any other form of visual display device. In addition, chipset 820 connects to one or more buses 850 and 855 that interconnect various modules 874, 860, 862, 864, and 866. In one embodiment, buses 850 and 855 may be interconnected together via a bus bridge 872 if there is a mismatch in bus speed or communication protocol. In one embodiment, chipset 820 couples with, but is not limited to, a non-volatile memory 860, a mass storage device(s) 862, a keyboard/mouse 864, and a network interface 866 via interface 824, smart TV 876, consumer electronics 877, etc.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface.

While the modules shown in FIG. 8 are depicted as separate blocks within the system 800, the functions performed by some of these blocks may be integrated within a single semiconductor circuit or may be implemented using two or more separate integrated circuits.

In a first example embodiment, an apparatus comprises core logic coupled to receive a first current; a clock generator to generate a first clock signal; and a closed loop current controller coupled to the clock generator and coupled to provide a second clock signal to the core logic based on the first clock signal, the current controller to control an amount of the first current received by the core logic by changing the first clock signal to generate the second clock signal.

In another example embodiment, the subject matter of the first example embodiment can optionally include that the first current is based on a voltage regulator (VR) current, and control of the first current controls the VR current.

In another example embodiment, the subject matter of the first example embodiment can optionally include that the closed loop current controller comprises: a current sensing unit to measure current into the core logic; a processing unit coupled to the current sensing unit to generate an output based on comparison between a current value associated with the measured current from the current sensing unit with a target current; and a clock adjustment unit coupled to receive the output from the processing unit, coupled receive the first clock signal from the clock generator, and coupled to provide the second clock signal to the core logic, the clock adjustment unit to change the first clock signal into the second clock signal to limit the first current into the core logic based on the output from the processing unit. In another example embodiment, the subject matter of this example embodiment can optionally include that the clock adjustment unit is to remove pulses of the first clock signal to create the second clock signal. In another example embodiment, the subject matter of this example embodiment can optionally include that the current measurement and sensing unit is to measure current passing through circuitry coupled to the core logic by measuring voltage over the circuitry. In another example embodiment, the subject matter of this example embodiment can optionally include that the circuitry comprises a power gate. In another example embodiment, the subject matter of this example embodiment can optionally include that the current sensing unit further comprises an analog-to-digital converter (ADC) to convert the voltage into a digital value.

In another example embodiment, the subject matter of the first example embodiment can optionally include that the processing unit comprises: current calculation logic to output a calculated current based on a voltage output from the current sensing unit; and an error amplifier and compensation network to compare calculated current to a target current and generate clock adjustment commands based on results of comparing the calculated current to a target current. In another example embodiment, the subject matter of this example embodiment can optionally include that the error amplifier and compensation network includes a proportional integral (PI) compensation network.

In another example embodiment, the subject matter of the first example embodiment can optionally include that the closed loop current controller includes a clock repetitive cycle adjustment unit to generate the second clock signal by adjusting dynamically an effective frequency of the first clock signal.

In a second example embodiment, a method for use in an integrated circuit (IC) having a core with core logic, comprises measuring current in the core; comparing a current value associated with the measured current with a target current; generating a clock adjustment command based on results of the current comparison; and adjusting a clock to the core logic based on the clock adjustment command.

In another example embodiment, the subject matter of the second example embodiment can optionally include generating and providing a first clock signal to the core logic, wherein adjusting a clock to the core logic comprise removing pulses of the first clock signal to create the second clock signal; and providing the second clock signal to the core logic.

In another example embodiment, the subject matter of the second example embodiment can optionally include that measuring the current in the core comprises measuring voltage over the circuitry in the core through which the current passes.

In another example embodiment, the subject matter of the second example embodiment can optionally include that the circuitry comprises a power gate.

In another example embodiment, the subject matter of the second example embodiment can optionally include converting, with an analog-to-digital converter (ADC), the voltage into a digital value.

In another example embodiment, the subject matter of the second example embodiment can optionally include that generating the clock adjustment command based on results of comparison between the measured current and the target current comprises generating a calculated current based on a voltage measured over circuitry through which the current passes and comparing calculated current to a target current, wherein the clock adjustment command is generated based on results of comparing the calculated current to a target current.

In another example embodiment, the subject matter of the second example embodiment can optionally include that adjusting the clock to the core logic based on the clock adjustment command comprises generating the second clock signal by adjusting dynamically an effective frequency of the first clock signal.

In another example embodiment, the subject matter of the second example embodiment can optionally include measuring the current in the core comprises: measuring voltages over a plurality of the circuitries in the core through which the current passes; generating an averaged voltage by averaging the measured voltages; and wherein generating the clock adjustment command based on results of comparison between the measured current and the target current comprises generating a calculated current based on the averaged voltage measured over the plurality of circuitries, and comparing calculated current to a target current, wherein the clock adjustment command is generated based on results of comparing the calculated current to a target current.

In a third example embodiment, an apparatus comprises a voltage regulator (VR) to generate a VR current; an integrated circuit (IC) coupled to the VR, the IC comprising core logic coupled to receive a first current, the first current based on the VR current; a clock generator to generate a first clock signal; and a closed loop current controller coupled to the clock generator and coupled to provide a second clock signal to the core logic based on the first clock signal, the current controller to control an amount of the first current received by the core logic by changing the first clock signal to generate the second clock signal.

In another example embodiment, the subject matter of the third example embodiment can optionally include that the closed loop current controller comprises: a current sensing unit to measure current into the core logic; a processing unit coupled to the current sensing unit to generate an output based on comparison between a current value associated with the measured current from the current sensing unit with a target current; and a clock adjustment unit coupled to receive the output from the processing unit, coupled receive the first clock signal from the clock generator, and coupled to provide the second clock signal to the core logic, the clock adjustment unit to change the first clock signal into the second clock signal to limit the first current into the core logic based on the output from the processing unit.

In another example embodiment, the subject matter of the third example embodiment can optionally include that the clock adjustment unit is to remove pulses of the first clock signal to create the second clock signal.

In another example embodiment, the subject matter of the third example embodiment can optionally include that the current measurement and sensing unit comprises: a differential amplifier to measure a voltage across circuitry through which the first is passing; and an analog-to-digital converter (ADC) to convert the voltage into a digital value.

In another example embodiment, the subject matter of the third example embodiment can optionally include that the processing unit comprises: current calculation logic to output a calculated current based on a voltage output from the current sensing unit; and an error amplifier and compensation network to compare calculated current to a target current and generate clock adjustment commands based on results of comparing the calculated current to a target current.

In another example embodiment, the subject matter of the third example embodiment can optionally include that the error amplifier and compensation network includes a proportional integral (PI) compensation network.

In another example embodiment, the subject matter of the third example embodiment can optionally include that the closed loop current controller includes a clock repetitive cycle adjustment unit to generate the second clock signal by adjusting dynamically an effective frequency of the first clock signal.

Some portions of the detailed descriptions described above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising:
   core logic coupled to receive a first current, wherein the first current is based on a voltage regulator (VR) current;
   a clock generator to generate a first clock signal; and
   a closed loop current controller coupled to the clock generator and coupled to provide a second clock signal to the core logic based on the first clock signal, the current controller to control an amount of the first current received by the core logic by changing the first clock signal to generate the second clock signal, wherein control of the first current controls the VR current.

2. An apparatus comprising:
   core logic coupled to receive a first current;
   a clock generator to generate a first clock signal; and
   a closed loop current controller coupled to the clock generator and coupled to provide a second clock signal to the core logic based on the first clock signal, the current controller to control an amount of the first current received by the core logic by changing the first clock signal to generate the second clock signal, wherein the closed loop current controller comprises a current sensing unit to measure current into the core logic;
   a processing unit coupled to the current sensing unit to generate an output based on comparison between a current value associated with the measured current from the current sensing unit with a target current; and
   a clock adjustment unit coupled to receive the output from the processing unit, coupled receive the first clock signal from the clock generator, and coupled to provide the second clock signal to the core logic, the clock adjustment unit to change the first clock signal into the second clock signal to limit the first current into the core logic based on the output from the processing unit.

3. The apparatus defined in claim 2 wherein the clock adjustment unit is to remove pulses of the first clock signal to create the second clock signal.

4. The apparatus defined in claim 2 wherein the current measurement and sensing unit is to measure current passing through circuitry coupled to the core logic by measuring voltage over the circuitry.

5. The apparatus defined in claim 4 wherein the circuitry comprises a power gate.

6. The apparatus defined in claim 4 wherein the current sensing unit further comprises an analog-to-digital converter (ADC) to convert the voltage into a digital value.

7. The apparatus defined in claim 2 wherein the processing unit comprises:
  current calculation logic to output a calculated current based on a voltage output from the current sensing unit;
  an error amplifier and compensation network to compare calculated current to a target current and generate clock adjustment commands based on results of comparing the calculated current to a target current.

8. The apparatus defined in claim 7 wherein the error amplifier and compensation network includes a proportional integral (PI) compensation network.

9. The apparatus defined in claim 2 wherein the closed loop current controller includes a clock repetitive cycle adjustment unit to generate the second clock signal by adjusting dynamically an effective frequency of the first clock signal.

10. An article of manufacture having one or more non-transitory computer readable storage media storing instructions which when executed by a system to perform a method comprising:
  generating and providing a first clock signal to the core logic;
  measuring current in the core;
  comparing a current value associated with the measured current with a target current;
  generating a clock adjustment command based on results of the current comparison; and
  adjusting the first clock to the core logic based on the clock adjustment command, wherein adjusting the first clock to the core logic comprises removing pulses of the first clock signal to create the second clock signal; and
  providing the second clock signal to the core logic.

11. The article of manufacture defined in claim 10 wherein measuring the current in the core comprises:
  measuring voltage over the circuitry in the core through which the current passes.

12. The article of manufacture defined in claim 11 wherein the method further comprises converting, with an analog-to-digital converter (ADC), the voltage into a digital value.

13. The article of manufacture defined in claim 11 wherein generating the clock adjustment command based on results of comparison between the measured current and the target current comprises:
  generating a calculated current based on a voltage measured over circuitry through which the current passes; and
  comparing calculated current to a target current, wherein the clock adjustment command is generated based on results of comparing the calculated current to a target current.

14. An article of manufacture having one or more non-transitory computer readable storage media storing instructions which when executed by a system to perform a method comprising:
  measuring current in the core;
  comparing a current value associated with the measured current with a target current;
  generating a clock adjustment command based on results of the current comparison; and
  adjusting a clock to the core logic based on the clock adjustment command, including generating the second clock signal by adjusting dynamically an effective frequency of the first clock signal.

15. The article of manufacture defined in claim 14 wherein measuring the current in the core comprises:
  measuring voltages over a plurality of the circuitries in the core through which the current passes;
  generating an averaged voltage by averaging the measured voltages; and
  wherein generating the clock adjustment command based on results of comparison between the measured current and the target current comprises
    generating a calculated current based on the averaged voltage measured over the plurality of circuitries, and
    comparing calculated current to a target current, wherein the clock adjustment command is generated based on results of comparing the calculated current to a target current.

16. An apparatus comprising:
  a voltage regulator (VR) to generate a VR current;
  an integrated circuit (IC) coupled to the VR, the IC comprising
    core logic coupled to receive a first current, the first current based on the VR current;
    a clock generator to generate a first clock signal; and
    a closed loop current controller coupled to the clock generator and coupled to provide a second clock signal to the core logic based on the first clock signal, the current controller to control an amount of the first current received by the core logic by changing the first clock signal to generate the second clock signal, wherein the closed loop current controller includes a clock repetitive cycle adjustment unit to generate the second clock signal by adjusting dynamically an effective frequency of the first clock signal.

17. The apparatus defined in claim 16 wherein the closed loop current controller comprises:
  a current sensing unit to measure current into the core logic;
  a processing unit coupled to the current sensing unit to generate an output based on comparison between a current value associated with the measured current from the current sensing unit with a target current; and
  a clock adjustment unit coupled to receive the output from the processing unit, coupled receive the first clock signal from the clock generator, and coupled to provide the second clock signal to the core logic, the clock adjustment unit to change the first clock signal into the second clock signal to limit the first current into the core logic based on the output from the processing unit.

* * * * *